United States Patent
Goto et al.

(10) Patent No.: US 9,397,475 B2
(45) Date of Patent: Jul. 19, 2016

(54) METHOD FOR ADJUSTING LIGHT EMITTING DEVICE

(71) Applicant: KABUSHIKI KAISHA TOPCON, Itabashi-ku (JP)

(72) Inventors: Yoshiaki Goto, Itabashi-ku (JP); Yoshikatsu Tokuda, Itabashi-ku (JP)

(73) Assignee: KABUSHIKI KAISHA TOPCON, Itabashi-ku (JP)

( * ) Notice: Subject to any disclaimer, the term of this patent is extended or adjusted under 35 U.S.C. 154(b) by 0 days.

(21) Appl. No.: 14/815,315

(22) Filed: Jul. 31, 2015

(65) Prior Publication Data

US 2016/0056609 A1    Feb. 25, 2016

(30) Foreign Application Priority Data

Aug. 22, 2014   (JP) .................. 2014-169429

(51) Int. Cl.
*H01S 5/065* (2006.01)
*H01S 5/042* (2006.01)
*H01S 5/062* (2006.01)

(52) U.S. Cl.
CPC .............. *H01S 5/065* (2013.01); *H01S 5/0428* (2013.01); *H01S 5/062* (2013.01); *H01S 5/06216* (2013.01)

(58) Field of Classification Search
CPC ..... H01S 5/042; H01S 5/0427; H01S 5/0428; H01S 5/062; H01S 5/065
See application file for complete search history.

(56) References Cited

U.S. PATENT DOCUMENTS

| 5,062,113 A | 10/1991 | Takahashi | |
|---|---|---|---|
| 2014/0247847 A1* | 9/2014 | Cox | H01S 5/06817 372/38.01 |
| 2014/0312233 A1* | 10/2014 | Mark | G01J 1/46 250/341.8 |

FOREIGN PATENT DOCUMENTS

| JP | 55-107282 | 8/1980 |
|---|---|---|
| JP | 7-109911 | 11/1995 |
| JP | 2002-368329 | 12/2002 |

* cited by examiner

*Primary Examiner* — Xinning Niu
(74) *Attorney, Agent, or Firm* — Oblon, McClelland, Maier & Neustadt, L.L.P.

(57) ABSTRACT

Light with a short pulse width is emitted using a simple structure. A light source 101, a differentiation circuit 102, and a switch 103 are connected in series. When the switch 103 is switched on, inrush current flows in a capacitor 102b forming the differentiation circuit 102, and accordingly the light source 101 is supplied with electric current and thereby emits light. When the capacitor 102b is charged, electric current flows in a resistor 102a, and voltage drops at the resistor 102a. Then, the voltage applied to the light source 101 is decreased, whereby the light source 101 stops emitting light. The values of the resistor 102a and the capacitor 102b are adjusted so that the above phenomenon occurs.

2 Claims, 13 Drawing Sheets

Variable capacitor (trimmer capacitor) and resistor

Capacitors selectable by switches and resistor

Capacitor and variable resistor

Capacitor and externally controllable variable resistor (Potentiometer)

Capacitor, resistor, and thermistor

METHOD FOR ADJUSTING LIGHT EMITTING DEVICE

BACKGROUND OF THE INVENTION

1. Technical Field

The present invention relates to a method for adjusting a light emitting device that can perform emission of pulsed light.

2. Background Art

In technology using laser light for measuring distances, various types of machining, etc., a short pulsed laser light with a pulse width of several tens to not more than several hundreds of picoseconds is desired. For example, in distance measurements using pulsed laser light, the precision of measuring distances can be improved by using pulsed light with a narrow pulse width. As a technique for generating laser light with a narrow pulse width, techniques disclosed in, for example, Japanese Examined Patent Application Publication No. 7-109911, Japanese Unexamined Patent Application Laid-Open No. 55-107282, and Japanese Unexamined Patent Application Laid-Open No. 2002-368329 are publicly known.

FIG. 1 shows a relationship between driving current and output light of a laser diode (LD). As shown in FIG. 1, when driving current is applied to the LD, a phenomenon may occur in which pulse-like light is emitted at first, the emitted light gradually decreases in the amplitude while oscillating, and light with a constant intensity is finally emitted. This phenomenon can be observed in typical laser diodes. The above oscillation in light intensity, which occurs in the initial stage of the light emission and gradually decreases, is called "relaxation oscillation".

In order to perform emission of light with a short pulse width, a method of applying driving current for a short period and performing emission of only initial pulsed light, as shown in FIG. 2, may be used. However, it is difficult to generate a driving current having a time length on the order of several tens to several hundreds of picoseconds using a simple circuit.

For example, a sine wave and a square wave of a frequency of approximately 200 MHz are easily obtained by using commercial ICs. However, for example, considering that the cycle of a high frequency of 100 MHz is $10^{-8}$ seconds (10 nanoseconds=10,000 picoseconds), it is not easy to obtain pulse-like driving current having a time length on the order of several tens to several hundreds of picoseconds.

The pulse-like driving current having a time length on the order of several tens to several hundreds of picoseconds can be obtained by using a high frequency technique in the microwave band. For example, a signal of several tens of GHz can be obtained by an oscillator using a YIG resonator, and the pulse-like driving current having a time length on the order of several tens to several hundreds of picoseconds can be obtained by utilizing this technique. Nevertheless, the high frequency technique in the microwave band may not be suitable for use for, for example, outdoor measuring devices and the like, in view of circuit scale, production cost, need for complicated adjustment, and large consumption of electric power.

SUMMARY OF THE INVENTION

In view of these circumstances, an object of the present invention is to provide a technique for performing emission of light with a short pulse width using a simple structure.

A first aspect of the present invention provides a method for adjusting a light emitting device including a light source, a capacitive reactance circuit, a resistance circuit, a differentiation circuit formed of the capacitive reactance circuit and the resistance circuit, which are connected in parallel, and a switching element. The light source generates relaxation oscillation immediately after electric current is applied thereto for driving light emission. The capacitive reactance circuit exhibits low impedance immediately after the electric current is applied and is charged by the electric charge. The resistance circuit discharges the electrical charge charged in the capacitive reactance circuit after a predetermined time passes after the electric current is applied. The light source and the differentiation circuit are connected in series. The switching element is configured to switch on or off for application of voltage to the light source and the differentiation circuit. The method includes adjusting characteristics of the capacitive reactance circuit and the resistance circuit so that one of the oscillations of the relaxation oscillation is obtained.

The phenomenon in which the relaxation oscillation occurs immediately after an electric current is applied for driving light emission is publicly known as typical characteristics of lasers, and in particular, laser diodes (LDs) are mentioned as light sources in which this phenomenon can easily occur. The capacitive reactance circuit, which exhibits low impedance immediately after the electric current is applied, has a function of storing electrical charge and generates inrush current when storing the electrical charge. As the capacitive reactance circuit, a capacitor element is described. A capacitance between wirings or conductor patterns may also be used instead of the capacitor element.

As the resistance circuit which discharges electrical charge charged in the capacitive reactance circuit after a predetermined time passes after the electric current is applied, a variety of resistance elements, a resistor using wiring, and a resistor using a variety of conductors or semiconductors may be described. The voltage-current characteristic of the resistance circuit need not necessarily be linear. For example, as the resistance circuit, a non-linear element such as a diode, and a three-terminal element such as an FET in which bias is appropriately set, may also be used.

The switching element is an element by which switching on or off of a circuit, that is, a conducting condition or a non-conducting condition can be selected. As the switching element, a semiconductor switch such as a bipolar transistor, an FET, or the like, may be described. In addition, as the switching element, an IC having a switching function may also be used. Alternatively, a two-terminal element, in which the condition is changed from non-conduction to conduction when a voltage of a threshold value or higher is applied, may also be used as the switching element. In this case, switching on or off of the circuit is controlled by changing power-supply voltage. The light source and the differentiation circuit are serially connected in a direct manner, but they can be serially connected via other circuits or devices.

According to a second aspect of the present invention, in the first aspect of the present invention, at least one of capacitance value and impedance of the capacitive reactance circuit may be adjusted so that electric current flows in the light source at not less than a threshold current value for oscillation immediately after the electric current is supplied to the capacitive reactance circuit and so that the electric current flows in the light source at an amount at which the light emission of the light source does not come to be an oscillation stationary state.

According to a third aspect of the present invention, in the second aspect of the present invention, resistance value of the resistance circuit may be adjusted to be not less than a value, at which electric current approximately equal to the threshold current value for oscillation of the light source flows and at which the light source does not emit light, and not more than a value, at which a difference between voltage dropped at the resistance circuit and a power-supply voltage is approximately equal to a forward direction voltage of the light source.

According to a fourth aspect of the present invention, in the third aspect of the present invention, the capacitance of the capacitive reactance circuit may be increased whereas the resistance value of the resistance circuit may be decreased in order to increase a peak value of the emitted light, and the capacitance of the capacitive reactance circuit may be decreased whereas the resistance value of the resistance circuit may be increased in order to decrease the peak value of the emitted light.

According to a fifth aspect of the present invention, in any one of the first to the fourth aspects of the present invention, the characteristics of the capacitive reactance circuit and the resistance circuit may be adjusted so that light of only initial oscillation of the relaxation oscillation is emitted.

According to the present invention, a technique for performing emission of light with a short pulse width using a simple structure is obtained.

PREFERRED EMBODIMENTS OF THE INVENTION

1. First Embodiment

Structure

Figure 3:
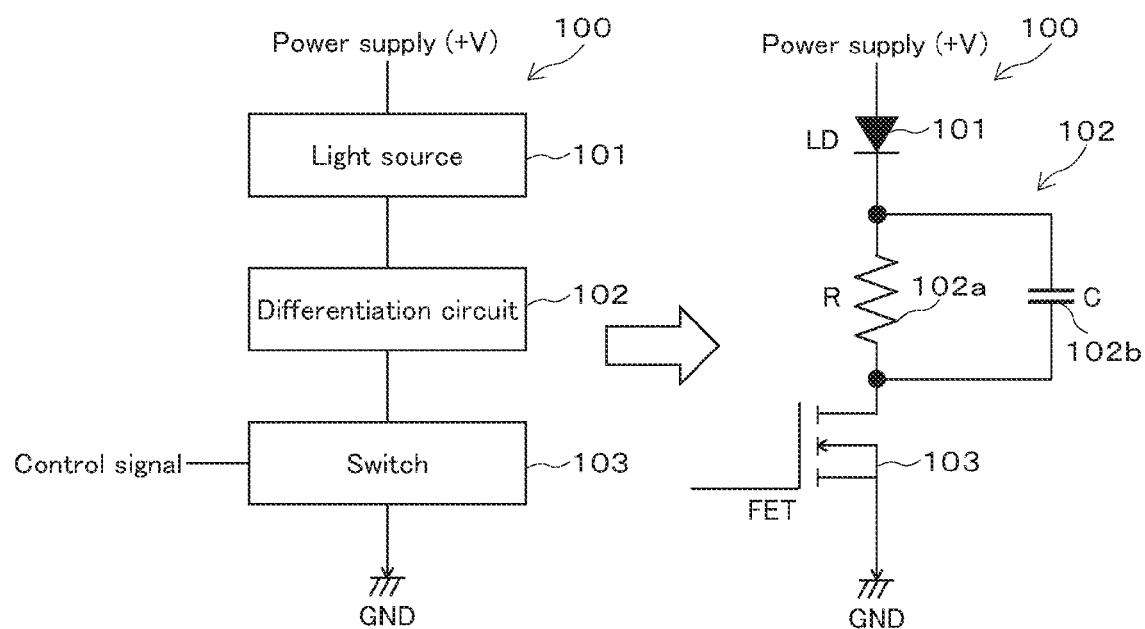
FIG. 3 is a block diagram and a circuit diagram of a light emitting device of an embodiment.

FIG. 3 shows a block diagram and a circuit diagram of a light emitting device 100 of an embodiment. The light emitting device 100 includes a light source 101, a differentiation circuit 102, and a switch 103, which are connected in series, and power-supply voltage V is applied between both ends of this serial connection. In this example, the light source 101 is a laser diode (LD), the differentiation circuit 102 is a circuit formed by connecting a resistor R (102a) and a capacitor C (102b) in parallel, and the switch 103 is an FET.

Regarding circuit constants, for example, the power-supply voltage is 5V, the resistance value of the resistor 102a is 200 ohm, the capacitance of the capacitor 102b is 20 pF, and a square wave with a frequency of approximately several tens of MHz at most is used as a control signal.

Operation

When the FET is switched off (there is no electric conduction between source and drain), the voltage V is not applied to the light source 101 and to the differentiation circuit 102, and the light source 101 does not emit light. When a control signal is applied to a gate electrode of the FET, and the switch 103 is switched on, electrical charge flows in the capacitor 102b, and inrush current is generated, whereby driving current flows in the light source 101. The driving current makes the light source 101 emit light.

As the electrical charge accumulates in the capacitor 102b, the inrush current is suddenly decreased. According to the decrease of the inrush current at the capacitor 102b, electric current flowing into the resistor 102b is increased. When the capacitor 102b is completely charged with the electrical charge, the electric current flowing into the capacitor 102b stops, and the value of the electric current flowing in the resistor 102a and the value of the electric current flowing in the light source 101 become the same.

Figure 2:
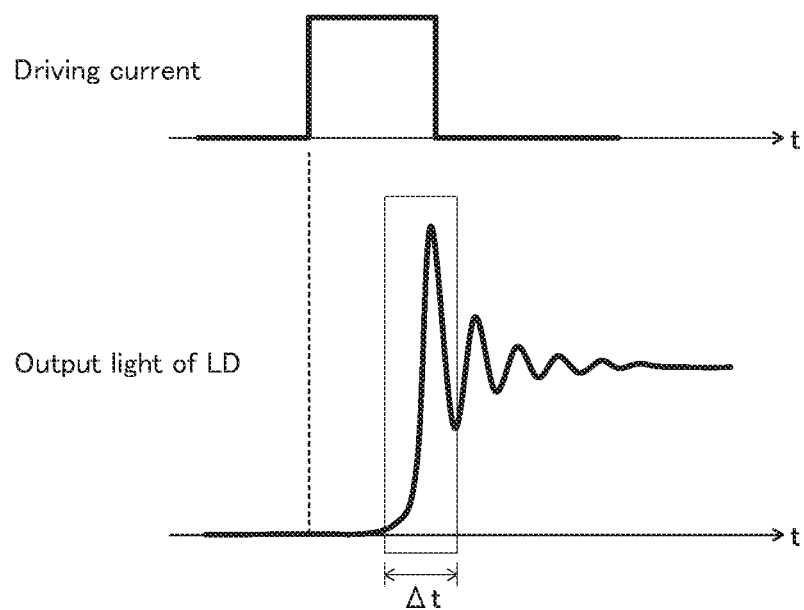
FIG. 2 is a diagram showing a relationship between driving current and intensity of emitted light of a laser diode (LD).

Here, the value of the power-supply voltage (+V) and the values of the capacitor 102b and the resistor 102a are set so that the charging period (inrush current flowing period) of the capacitor 102b is approximately the same as the length of Δt in FIG. 2. When the inrush current stops flowing into the capacitor 102b, the voltage drops at the resistor 102a, thereby decreasing the voltage applied to the light source 101. The value of the resistor 102a and the other parameters are selected so that the light source 101 stops emitting light by this decrease in the voltage. In other words, when the inrush current stops flowing into the capacitor 102b, electric current flows in the resistor 102a, whereby the resistor 102a controls (limits) electric current flowing into the light source 101. Then, it can also be understood that the value of the resistor 102a and the other parameters are set so that the value of LD current flowing in the light source 101 is made less than a threshold value for light emission by this electric current control.

Figure 1:
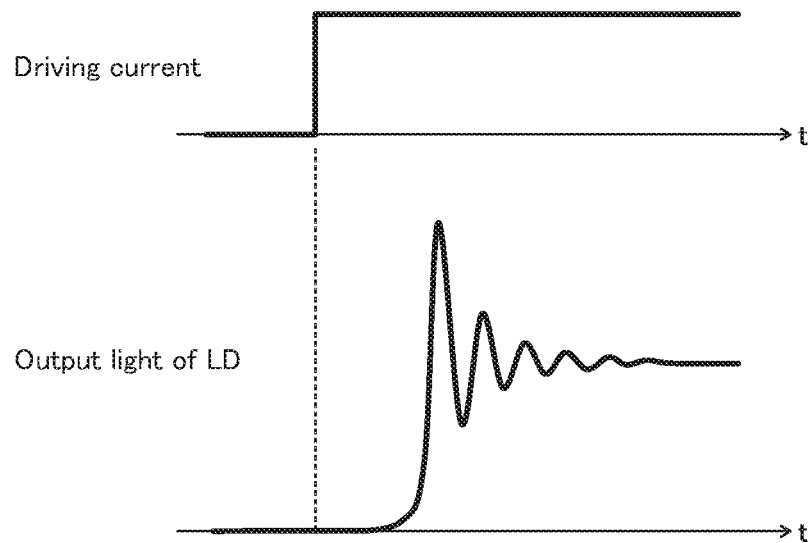
FIG. 1 is a diagram showing a relationship between driving current and intensity of emitted light of a laser diode (LD).

According to these structures and the setting of the parameters, the light source 101 emits light while the capacitor 102b is charged, and immediately after that, voltage drops (electric current is limited) at the resistor 102a. Then, the voltage applied to the light source 101 (the value of electric current flowing in the light source 101) is decreased, whereby the light source 101 stops emitting light. As a result, the generation of subsequent relaxation oscillation, as shown in FIGS. 1 and 2, is suppressed, and only the initial pulse of light is emitted.

Figure 4:
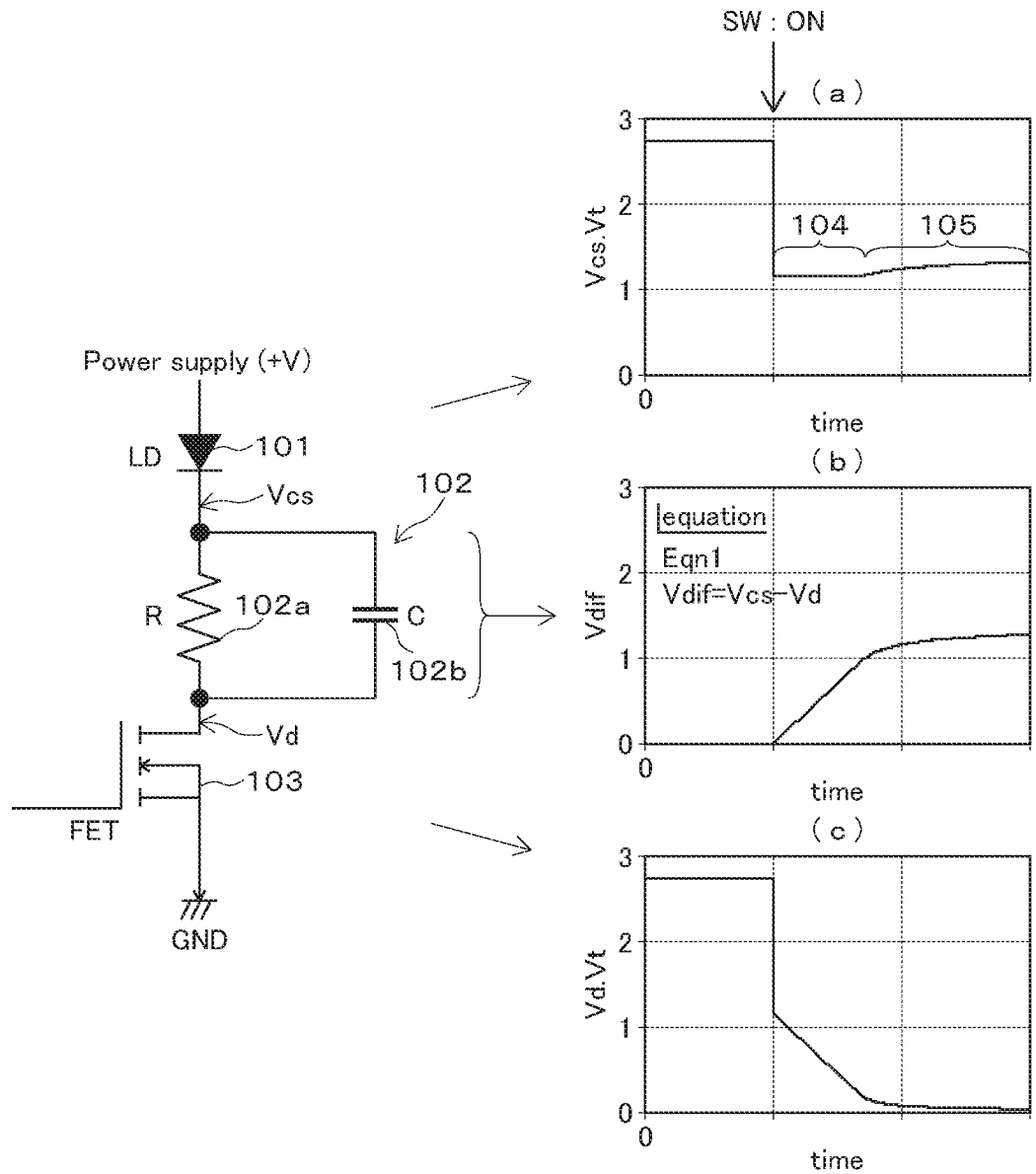
FIG. 4 is a circuit diagram of an embodiment, and graphs (a) to (c) showing changes in voltage at each part.
Figure 5:
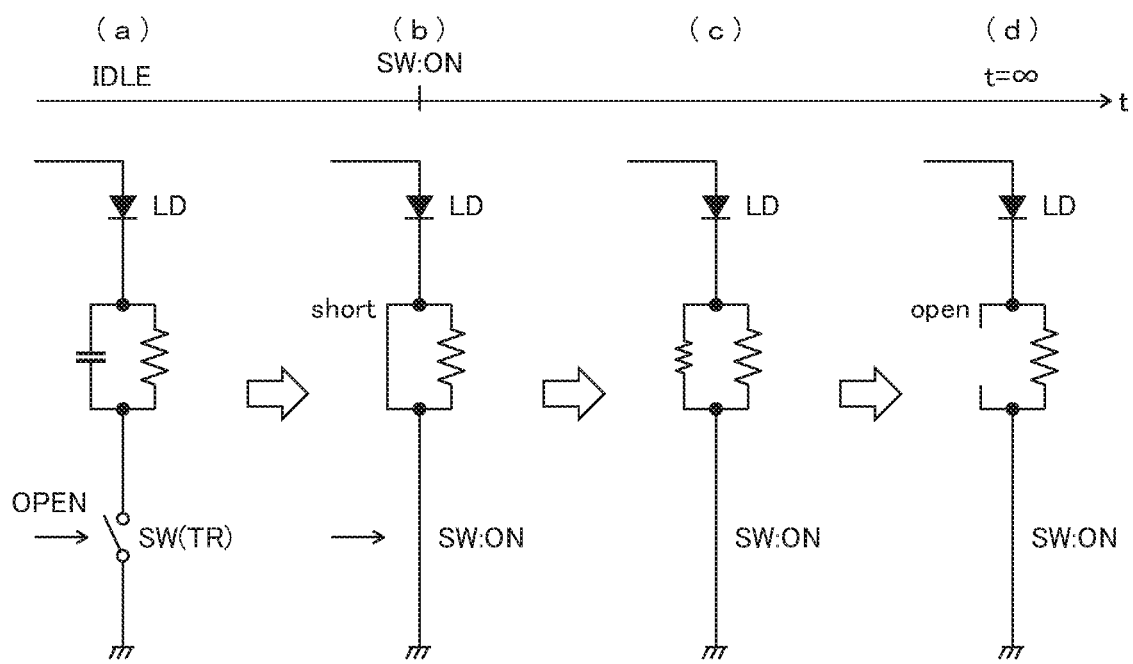
FIG. 5 is a conceptual diagram for explaining operation of a differentiation circuit.

The above operation will be described in more detail with reference to the figures hereinafter. FIG. 4 shows graphs (a) to (c) showing changes in voltage applied at each part. The graph (a) shows a voltage Vcs in the light source 101 side of the differentiation circuit 102. The voltage of V-Vcs is the voltage to be applied to the light source 101. The graph (b) shows a voltage to be applied to the differentiation circuit 102, that is, a voltage Vdif to be applied to the resistor 102a and the capacitor 102b. The graph (c) shows a voltage Vd to be applied between the source and the drain of the switch 103. FIG. 5 is a conceptual diagram showing operating conditions of the differentiation circuit 102 as time passes from (a) to (d).

When the time is (a) in FIG. 5, the switch 103 is in a condition before being switched on (that is, it is in a condition of being switched off). In this stage, the power-supply voltage V is not applied to the light source 101 and the differentiation circuit 102. After the switch 103 is switched on, the capacitor 102b starts to charge, and inrush current flows in the capacitor 102b. In the first stage, the capacitor 102b is electrically shorted, and flowing electric current primarily includes the inrush current into the capacitor 102b (refer to the view at time (b) in FIG. 5). By making the inrush current flow into the capacitor 102b, driving current flows in the light source 101, and the light source 101 emits light.

Then, as the capacitor 102b is gradually charged, the resistance value of the capacitor 102b is gradually increased, and electric current flowing in the resistor 102a is increased. This condition is shown in the views at times (b) and (c) in FIG. 5. In the stage at the time (b) in FIG. 5, the voltage Vdif applied to the differentiation circuit 102 is gradually increased. This is because the voltage drops at the resistor 102b.

While the inrush current at the capacitor 102b is generated (the period indicated by the reference numeral 104 in the graph (a) in FIG. 4), the potential of the electrode in the switch 103 side of the capacitor 102b is gradually decreased (gradually decreased to ground potential), whereby the value of Vd fluctuates as shown in the graph (c) in FIG. 4.

According to decrease in the inrush current at the capacitor 102b, the electric current flowing into the resistor 102a is increased, and the voltage drops at the resistor 102a, whereby the voltage applied to the light source 101 is decreased. In other words, the effect of the voltage drop generated at the resistor 102a is increased with respect to the power-supply voltage V, and the voltage applied to the light source 101 is decreased accordingly. The resistance value of the resistor 102a and the other parameters are set so that the voltage applied to the light source 101 at that time is less than the threshold value for the light emission. That is, the resistance value of the resistor 102a and the other parameters are set so that the voltage applied to the light source 101 becomes less than the threshold value for the light emission by the voltage drop generated at the resistor 102a in the period 105 shown in graph (a) in FIG. 4.

Thus, the light source 101 emits light during the period 104 and stops emitting light during the period 105. Here, the values of CR of the differentiation circuit 102 are adjusted so that the length of the period 104 approximately corresponds to the length of the period Δt shown in FIG. 2, whereby only one pulse of light at the initial stage is emitted.

In this condition (period 105), when the switch 103 is switched off, the electric current stops flowing into the light source 101, and the electrical charge charged in the capacitor 102b flow in the resistor 102a and are consumed. Thus, the condition returns to the initial condition in which the switch 103 is switched off.

Then, by switching on the switch 103 again, the operation in the same manner as described above is repeated, and a second pulse of light is emitted by the light source 101. Accordingly, by repeating switching on and off of the switch 103, the light source 101 is made to emit a pulse of light repeatedly. Setting of CR of Differentiation Circuit In order to apply voltage at or above a threshold value to the light source 101 during only the period Δt in FIG. 2 as described above, selecting appropriate values of CR of differentiation circuit 102 is important. The method of selecting the values of the CR of the differentiation circuit 102 will be described hereinafter.

In order to generate pulsed light, it is necessary to make electric current flow in the light source (laser diode, LD) 101 at an amount in the range for generating the phenomenon as follows. The lower limit of the electric current is the current value at which the light source 101 starts to emit light (a threshold current value for oscillation), and the upper limit is the current value at which only the initial pulse of the relaxation oscillation is generated. In order to generate the LD current within this range, the constants of the C and the R forming the differentiation circuit must be adjusted.

First, as an initial condition of the circuit, a condition is assumed in which there is no electrical charge in the capacitor 102b and the switch 103 is switched off. In this condition, since electric current does not flow in the resistor 102a and in the capacitor 102b, electric current also does not flow in the light source (LD) 101. Naturally, the light source 101 does not emit light.

When the switch 103 is switched on, voltage is suddenly applied to the resistor 102a and the capacitor 102b. Since this sudden change in the voltage has a high frequency component, electric current flows into the capacitor 102b having lower alternating current impedance than the resistor 102a. This phenomenon can also be understood such that inrush current flows into the capacitor 102b, to which application of the DC voltage is started, according to the accumulation of electrical charge therein. Since the capacitor 102b and the resistor 102a are connected in parallel, immediately after the switch 103 is switched on, the electric current flowing into the capacitor 102b is the same as the electric current flowing into the light source 101 and makes the light source 101 emit light. The capacitor 102b is gradually charged with electrical charge as time passes, and the electric current stops flowing into the capacitor 102b when the amount of the accumulated electrical charge reaches the capacitance of the capacitor 102b. The voltage drops (electric current is limited) at the resistor 102b at this time, whereby the light source 101 is made to stop light emission even though the switch 103 is switched on.

It can be understood from the above description that electric current flows in the light source 101 due to the inrush current at the capacitor 102b, which is generated while the electrical charge accumulates in the capacitor 102b. Therefore, by appropriately setting the value of the capacitance of the capacitor 102b, the amount of the electric current flowing in the light source 101 is determined, whereby electric current in the range necessary for emitting a pulse of light is obtained.

While the above phenomenon occurs, as the electrical charge accumulates in the capacitor 102b, the voltage applied to the capacitor 102b is increased. Since the capacitor 102b and the resistor 102a are connected in parallel, the voltages at the capacitor 102b and at the resistor 102a are equal in value. Therefore, when the voltage applied to the capacitor 102b is increased, the electric current flowing in the resistor 102a is also increased. This electric current flowing in the resistor 102a makes the voltage drop at the resistor 102a, whereby the voltage applied to the light source 101 is decreased.

Since the LD current does not flow when the voltage is lower than a forward direction voltage of the LD, the resistor 102a functions to limit the LD current. Therefore, by appropriately selecting the value of the resistor 102a, the following condition is obtained. That is, the LD current flows and makes the light source 101 emit light when the value of the electric current flowing in the resistor 102a is small, and the LD current stops flowing and the light source 101 stops light emission when the value of the electric current flowing in the resistor 102a is large.

In cases of performing continuous emission of pulses of light, the electrical charge charged in the capacitor 102b must be discharged so as to make the LD current flow in the light source 101 again. This discharge is performed by the resistor 102b that is connected with the capacitor 102b in parallel. Specifically, when the switch 103 is switched off, the resistor 102a connected with the capacitor 102b in parallel discharges the electrical charge charged in the capacitor 102b, and the circuit shown in FIG. 3 returns to the initial condition. Accordingly, the resistor 102a has a first function of limiting the LD current and suppressing subsequent relaxation oscillation so that single pulsed light is emitted and has a second function of discharging the electrical charge charged in the capacitor 102b and making the circuit return to the initial condition for the next pulsed light emission.

The indication for setting the values of the capacitor C (102b) and the resistor R (102a) is described as follows.
(1) The minimum value of C: Capacitance value so that electric current flows in the LD at not less than the threshold current value for oscillation.
   (If it is too small, the LD does not oscillate.)
(2) The maximum value of C: Capacitance value so that electric current flows for generating only an initial pulse in the relaxation oscillation and suppressing subsequent pulses (depending on the value of R).
   (If it is too large, continuous relaxation oscillation occurs.)
(3) The minimum value of R: Resistance value so that the value of the LD current is the same as the threshold current value for oscillation.
   (If it is too small, continuous relaxation oscillation occurs.)
(4) The maximum value of R: Resistance value so that a difference between the voltage dropped at the R and the power-supply voltage is the same as the value of the forward direction voltage of the LD (depending on the value of C).
   (If it is too large, the discharge is not completed before the next pulse generation pulse.)

In addition, the peak value of the pulsed light and the values of C and R have approximately the following relationships.
   In order to increase the intensity of the light pulse, the value of C is increased, while the value of R is decreased.
   In order to decrease the intensity of the light pulse, the value of C is decreased, while the value of R is increased.

It should be noted that the values of C and R may not be uniquely determined because there is a correlation between C and R. In addition, the values of C and R must be selected in consideration of the effect of suppressing the subsequent relaxation oscillation.

Since the peak value of the pulsed light is far more affected by the value of C than by the value of R, the value of the C should be approximately adjusted, whereas the value of R should be finely adjusted.

Figure 6A:
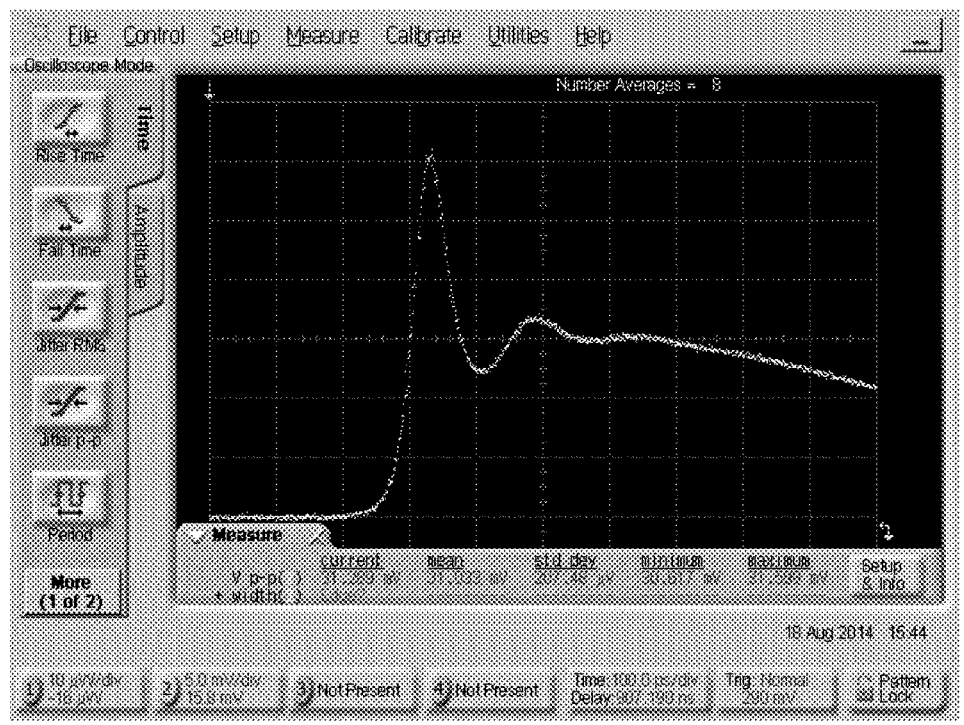
FIGS. 6A and 6B are views showing waveforms of emitted light.
Figure 6B:
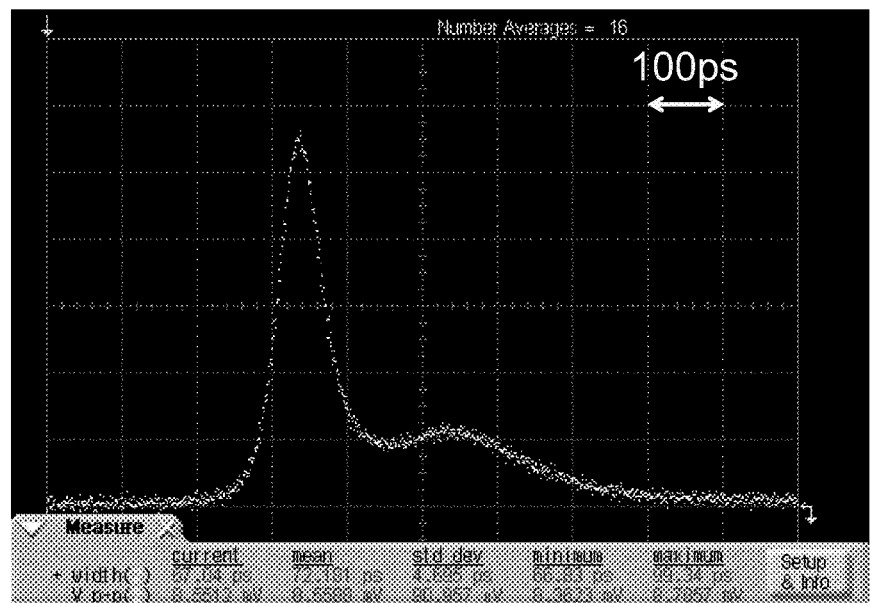

Specific examples will be described hereinafter. FIG. 6A shows a case in which plural pulses are generated instead of a single pulse, that is, a case in which continuous relaxation oscillation occurs. FIG. 6B shows a case in which a single pulse is generated, but there can be seen a small effect of the subsequent relaxation oscillation. The phenomena as shown in FIGS. 6A and 6B occur when the value of the LD current is too large. Therefore, in order to reduce the value of the LD current, the value of C is decreased, and then the value of R is finely adjusted. It should be noted that there may be cases in which the peak of the emitted light is small, and the light may not even be emitted, if the value of C is made too small.

Figures 7, 8:
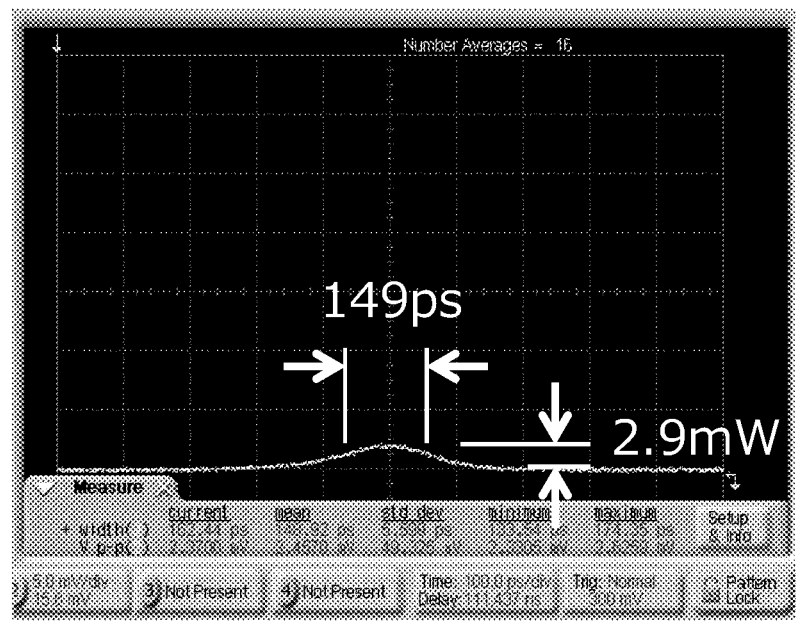
FIG. 7 is a view showing a waveform of emitted light.
FIG. 8 is a view showing a waveform of emitted light.

FIG. 7 shows a case, in which the emitted light has a small peak and a wide pulse width. In such a case, the value of the LD current is too small, and therefore, the value of C is increased, and then the value of R is finely adjusted. For reference, an example of a waveform of a pulsed light when the values are adjusted appropriately is shown in FIG. 8.

Advantages

According to the above structure, the period of emitting light by the light source 101 (width of the emitted pulsed light) can be shorter than the period during which the switch 103 is switched on. Specifically, even when the control signal for driving the switch 103 has a wide pulse width, and the switch 103 is thereby switched on for a long period, the light source 101 is made to stop emitting light when the capacitor 102b is charged completely. This is because the voltage applied to the light source 101 is decreased compared to the initial level and becomes lower than the threshold voltage due to the voltage drop occurring at the resistor 102a at that timing. That is, the light source 101 is made to emit light by using a phenomenon in which the inrush current at the capacitor 102b occurs, whereby the light source 101 can be made to emit light for an extra short period even when the switch 103 is switched on for a long period.

In other words, by using the inrush current occurring while the capacitor 102b is charged and by using the voltage drop occurring at the resistor 102a according to the decrease in the inrush current, the light source 101 can be made to emit a pulse of light with a pulse width shorter than that of the control signal for controlling the switch 103 even when the control signal has a low frequency. Therefore, for example, even in cases of generating a pulse of light with a pulse width on the order of several tens to several hundreds of picoseconds, the control signal for controlling the switch 103 need not have a pulse width on the order of several tens to several hundreds of picoseconds.

The above operation can be understood as a phenomenon in which the electric current is increased at the resistor 102a as the charge in the capacitor 102b progresses and is thereby limited by the resistor 102a, whereby the electric current flowing into the light source (LD) 101 is decreased, and the subsequent relaxation oscillation is suppressed. According to the experiments and computer simulation conducted by the inventors of the present invention, it was confirmed that the pulse width of the light emitted by the light source 101 can be approximately several tens to several hundreds of picoseconds. It should be noted that the pulse width of the emitted pulsed light is not limited to the order of several tens to several hundreds of picoseconds.

As shown in FIG. 3, the circuit for generating pulsed light using the present invention is very simple and can be made so as to be small and light in weight and to consume low levels of electrical power, and at a low production cost. The control signal for controlling the function of the switch 103 can be obtained by using a commercial IC (such as a FPGA in which a signal generating circuit is formed), and no expensive, complicated oscillating circuit is necessary.

In addition, according to the structure shown in FIG. 3, the peak value of the generated pulsed light is not susceptible to variation in the power-supply voltage. In general, when the power-supply voltage is directly applied to the LD, the intensity of emitted light is greatly affected by the variation and the deviation of the power-supply voltage. Therefore, stabilization of the power supply must be taken into consideration. However, compared with cases of directly connecting the power supply, the effect of the power-supply voltage on the intensity of emitted light is small in cases of using the inrush current at the capacitor as the LD current. The detailed reasons for this phenomenon have not been clear, but it can be thought that, by using the inrush current at the capacitor as the LD current, the electric current flow to the LD is affected primarily by the capacitor, and the effect of the power supply is relatively decreased.

Other Matters

Although an example of using a positive power supply is shown in FIG. 3, an embodiment operated by a negative power supply can also be used. When a negative power supply is used, the light source 101 side is grounded, and the switch 103 side is connected with the negative power supply (−V). In addition, although an FET is used as the switch 103 in FIG. 3, a bipolar transistor or another switching element may be used. Moreover, an element functioning as a capacitor may be used as C instead of a normal capacitor element. Furthermore, an element functioning as a resistance (for example, an FET to which a bias is applied, or the like) may be used as R instead of a normal resistance element.

FIGS. 9A and 9B and FIGS. 10A to 10C show modified examples of the circuit structure shown in FIG. 3. The circuits shown in FIGS. 9A and 9B and FIGS. 10A to 10C will be describe hereinafter. FIGS. 9A and 9B and FIGS. 10A to 10C show examples of cases using negative power supplies.

Figure 9A:
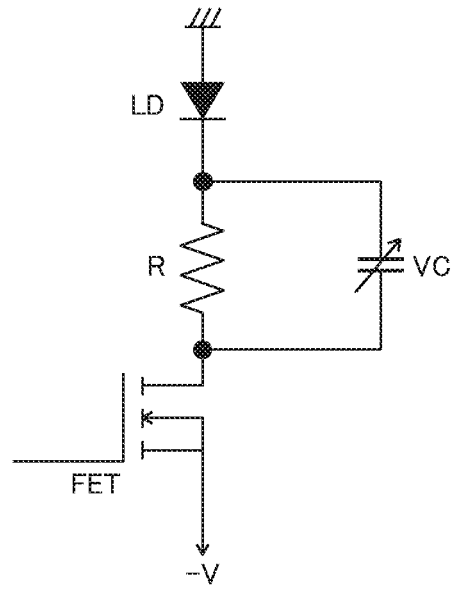
FIGS. 9A and 9B are circuit diagrams of embodiments.
Figure 9B:
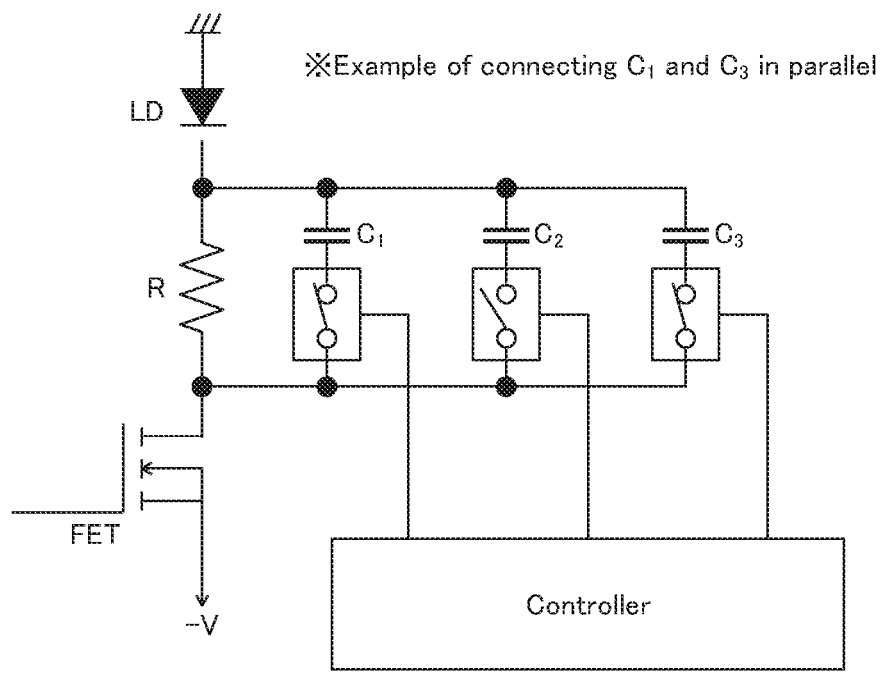

FIG. 9A shows an example of a case using a variable capacitor as the capacitor of the differentiation circuit. In the example shown in FIG. 9A, a variable capacitor is used as the capacitor of the differentiation circuit, whereby the capacitance of the differentiation circuit is easily adjusted. FIG. 9B shows a structure in which multiple capacitors are connected in parallel via switches, and the capacitance is adjusted by switching the switches on and off. As the plural capacitors, capacitors having different capacitance from each other may be used, but capacitors having the same capacitance can also be used. In the example shown in FIG. 9B, by changing the combination of the capacitors, the capacitance of the differentiation circuit is easily adjusted.

Figure 10A:
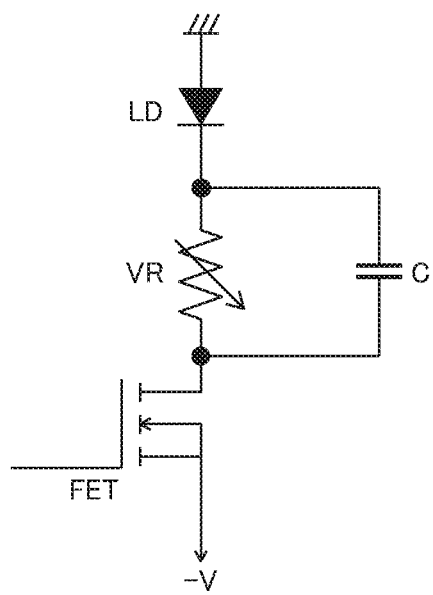
FIGS. 10A to 10C are circuit diagrams of embodiments.
Figure 10B:
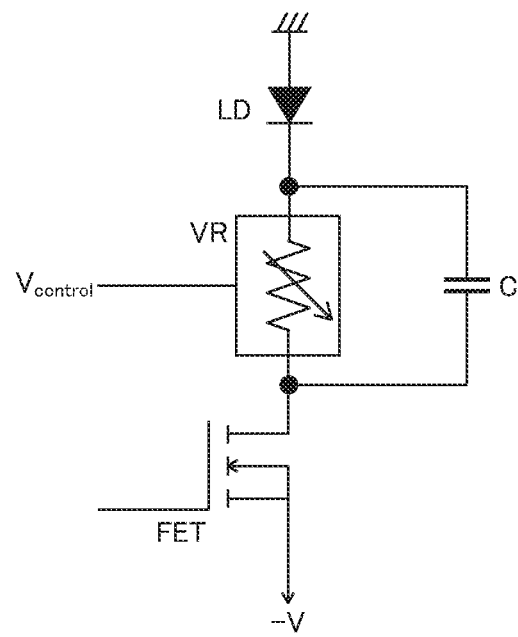
Figure 10C:
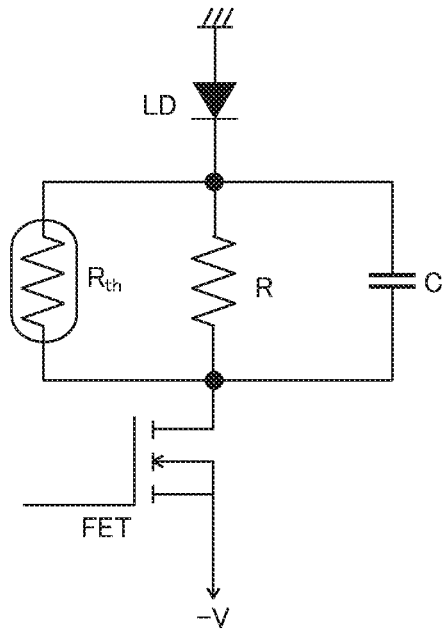

FIG. 10A shows an example of using a variable resistor as the resistor of the differentiation circuit. FIG. 10B shows an example of using a variable resistor, which can be varied by a control signal, as the variable resistor shown in FIG. 10A. By forming the circuit structure as shown in FIG. 10A or 10B, the resistance value of the resistor forming the differentiation circuit is easily adjusted. FIG. 10C shows an example of connecting a thermistor with the resistor forming the differentiation circuit in parallel. By using the thermistor, temperature characteristics of the light source can be compensated for.

As an example of a structure in which the resistance value is adjustable, a structure, in which plural resistors are connected in parallel via switches, as shown in FIG. 9B, and the resistance value is set by selecting the switches to be switched on, may be described. In addition, by combining this structure with the structure shown in FIG. 9B and by selecting the switches to be switched on, both the resistance value of the resistor and the capacitance of the capacitor of the differentiation circuit can be adjustable. As the plural resistors, resistors having different resistance from each other may be used, but resistors having the same resistance can also be used.

2. Second Embodiment

Figure 11:
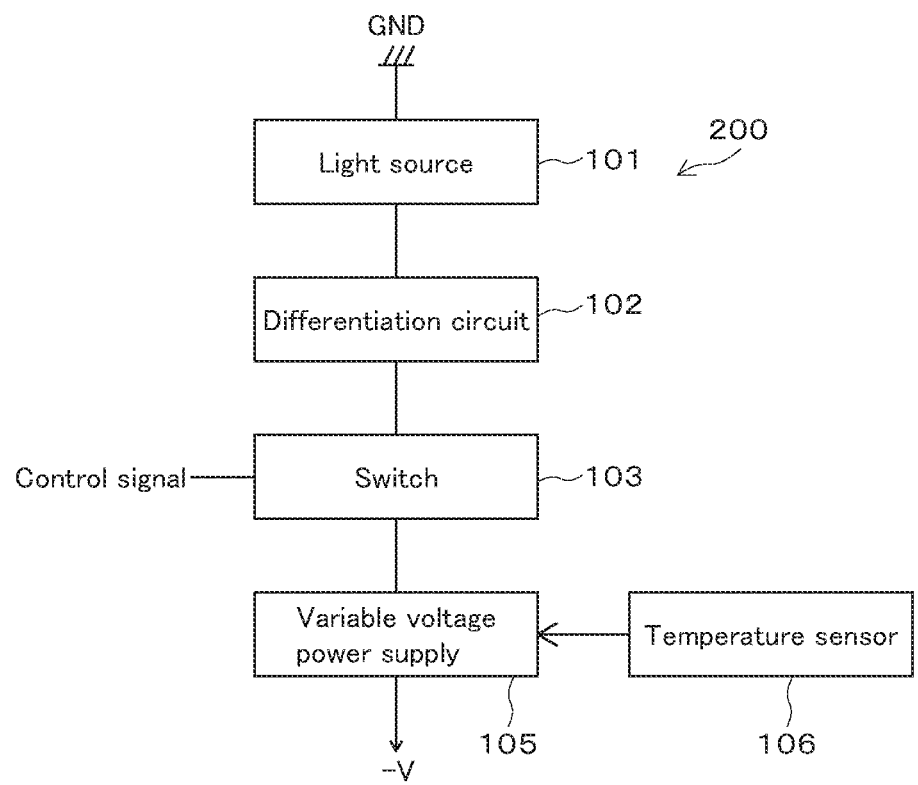
FIG. 11 is a block diagram of an embodiment.

The intensity of light emitted by the laser diode (LD) is temperature-dependent. Here, an example of a structure for decreasing variation of the intensity of emitted light of the light source due to temperature change will be described. FIG. 11 shows a block diagram of this embodiment. FIG. 11 shows a light emitting device 200 including a variable voltage power supply 105, a temperature sensor 106, a light source 101, a differentiation circuit 102, and a switch 103. Here, the light source 101, the differentiation circuit 102, and the switch 103 are the same as in the First Embodiment shown in FIG. 3.

The variable voltage power supply 105 is a negative power supply and varies the value of output voltage according to the temperature detected by the temperature sensor 106. The negative voltage set and generated by the variable voltage power supply 105 is applied to the circuit in which the light source 101, the differentiation circuit 102, and the switch 103 are connected in series.

Figure 12:
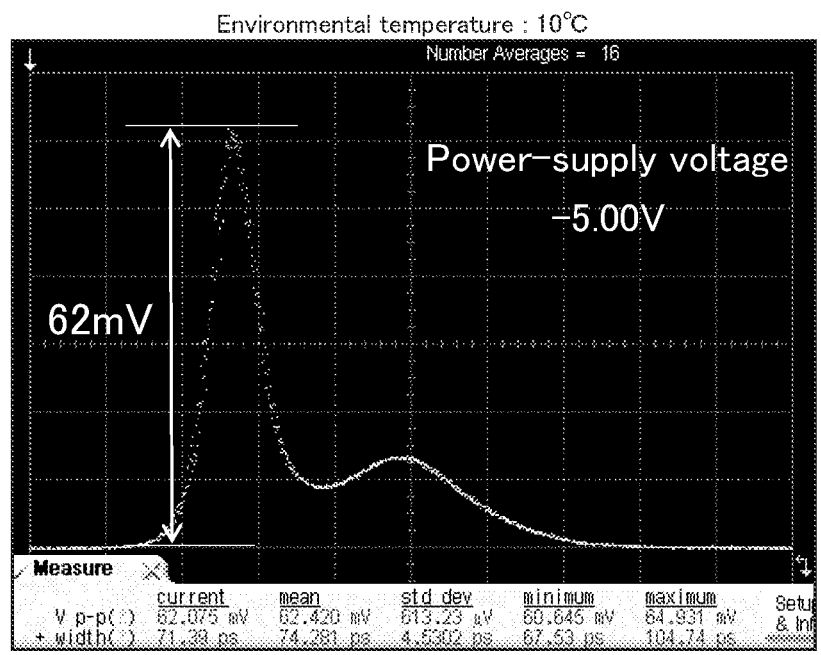
FIG. 12 is a view showing waveforms of emitted light.
Figure 12:
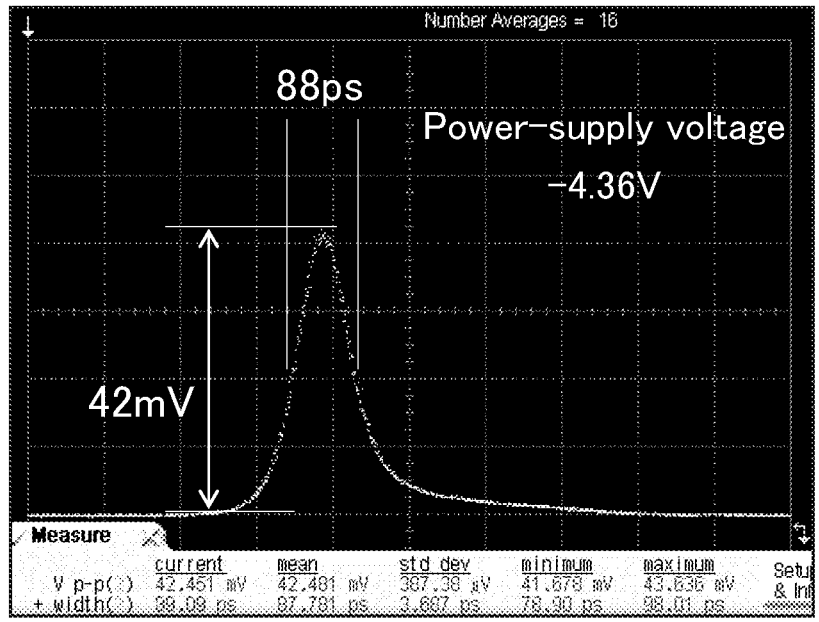
Figure 13:
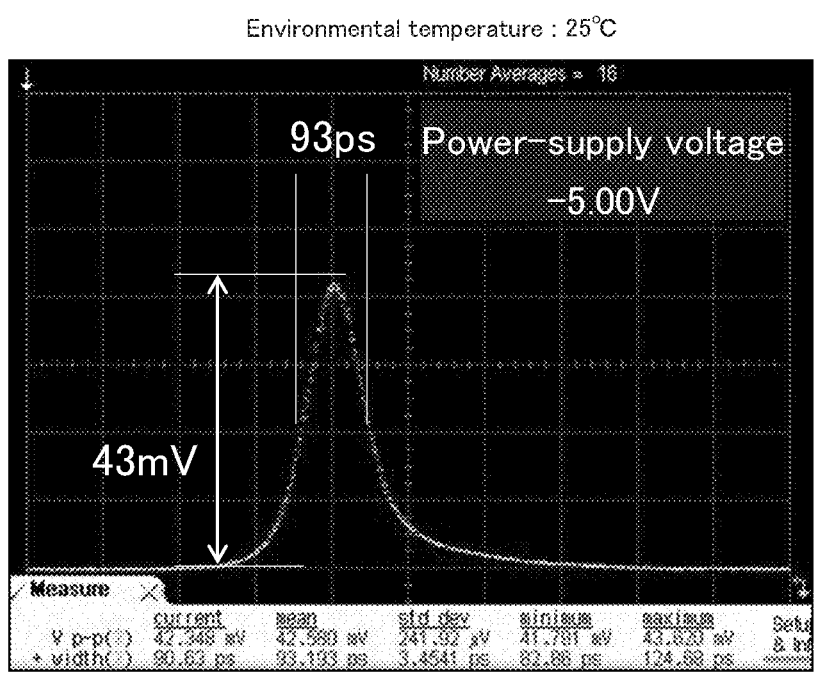
FIG. 13 is a view showing a waveform of emitted light.
Figure 14:
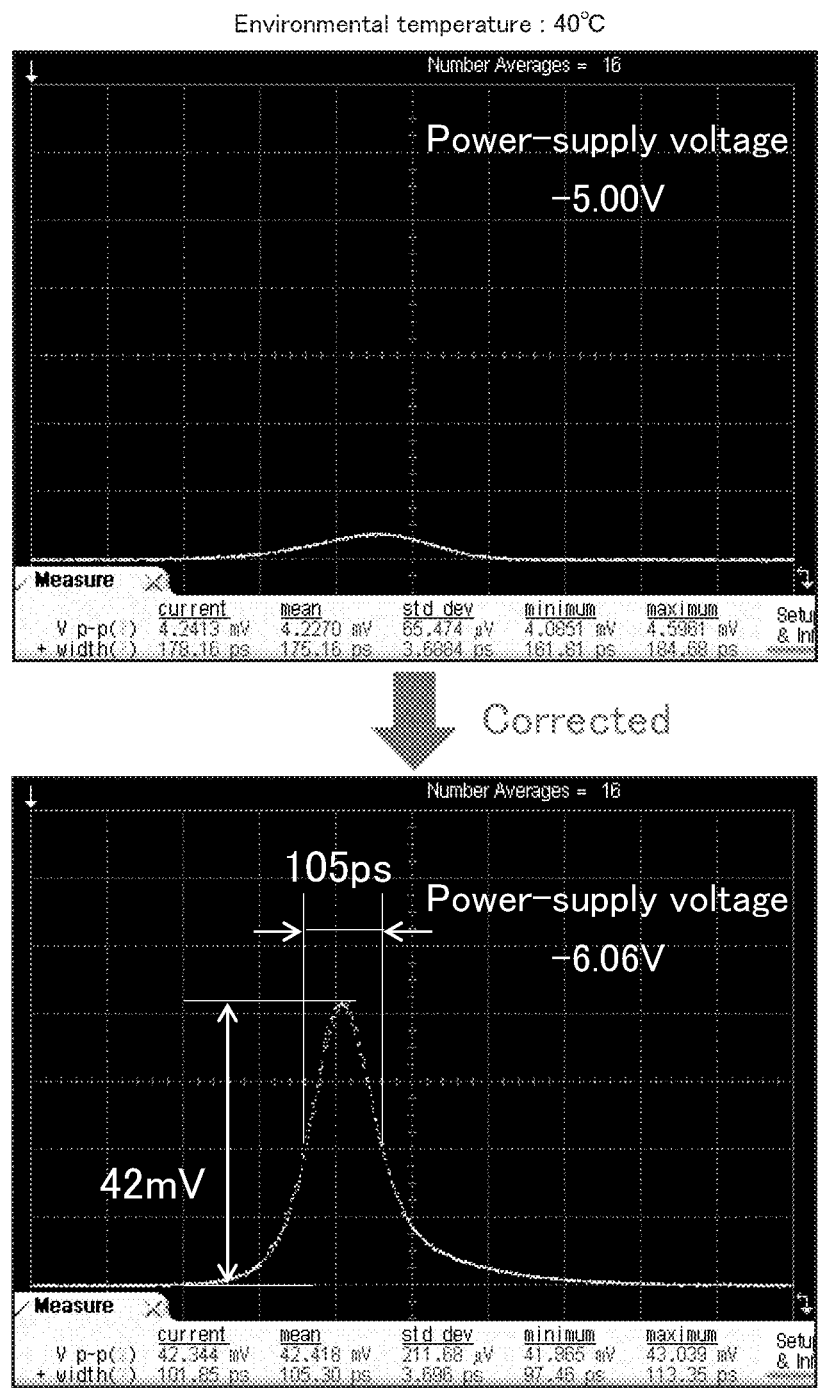
FIG. 14 is a view showing waveforms of emitted light.

FIGS. 12 to 14 show relationships between environmental temperature, power-supply voltage, and waveform and peak value of pulsed light in a case of using the circuit structure shown in FIG. 11. As shown in FIGS. 12 to 14, when the power-supply voltage is constant, the peak value of the pulsed light emitted by the light source 101 constructed of the laser diode greatly varies depending on the environmental temperature. However, as shown in FIGS. 12 and 14, by changing the power-supply voltage according to the environmental temperature, pulses of light with approximately the same waveform and approximately the same peak value can be obtained.

The variable voltage power supply 105 houses a controller using a microcomputer. The microcomputer has a memory part that stores data tables of results of examining the relationship between the environmental temperature and the power-supply voltage, which are necessary for obtaining particular peak values. Regarding the operation of the variable voltage power supply 105, the variable voltage power supply 105 is controlled so as to output corresponding power supply voltage by applying the environmental temperature detected by the temperature sensor 106 to the data tables.

Since laser diodes (LDs) are generally greatly affected by power-supply voltages, when the power-supply voltage is directly applied to the LD, the change in the intensity of emitted light by changing the power-supply voltage would be difficult in view of reproducibility. However, in the case of using the inrush current at the capacitor for making the LD emit light, the effect of the power supply is reduced, whereby adjustment of the intensity of emitted light by changing the power-supply voltage can be performed at a high level of reproducibility.

3. Third Embodiment

Figure 15A:
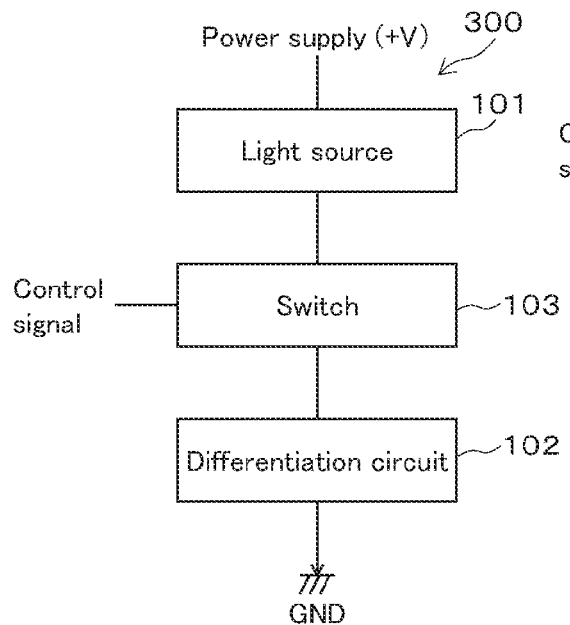
FIGS. 15A and 15B are block diagrams of light emitting devices of embodiments.

FIG. 15A shows a light emitting device 300 having a switch 103 at a position different from the case shown in FIG. 3. In the light emitting device 300, the switch 103 is arranged between a light source 101 and a differentiation circuit 102. The light emitting device 300 is an example in which the light source and the differentiation circuit are connected in series. The light source 101, the differentiation circuit 102, and the switch 103 of the light emitting device 300 are the same as those described relating to the structure shown in FIG. 3.

The operation of the light emitting device 300 is the same as that of the light emitting device 100 shown in FIG. 3. The operation of the light emitting device 300 will be simply described hereinafter. When the switch 103 is switched off, no voltage is applied to the capacitor (the reference numeral 102b in FIG. 3) of the differentiation circuit and also, no voltage is applied to the light source 101, whereby the light source 101 does not emit light. When the switch 103 is switched on, voltage is applied to the capacitor (the reference numeral 102b in FIG. 3) of the differentiation circuit 102, and inrush current flows. By making the inrush current flow, electric current flows in the light source 101, and the light source 101 emits light.

Then, when the capacitor (the reference numeral 102b in FIG. 3) of the differentiation circuit 102 is charged, electric current flows in the resistor (reference numeral 102a in FIG. 3) that is connected with the capacitor in parallel, and the voltage drops (electric current is limited) at the resistor, whereby the light source 101 stops emitting light. Thus, light of only the initial pulse in the relaxation oscillation is emitted.

Figure 15B:
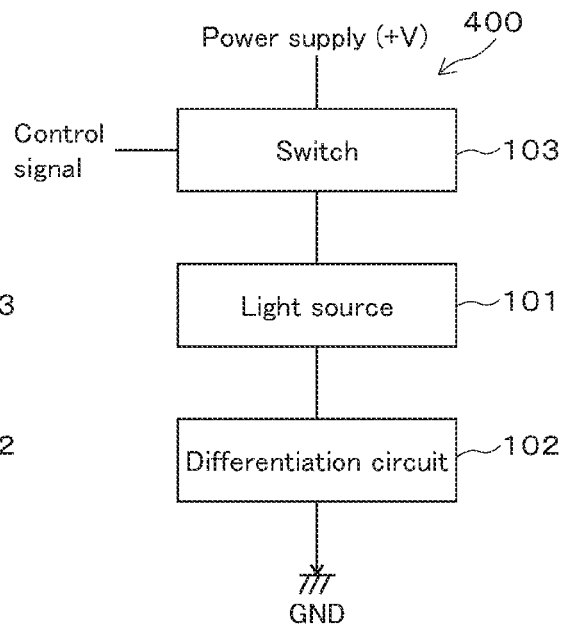

FIG. 15B shows a light emitting device 400 having a switch 103 at a position different from the cases shown in FIGS. 3 and 15A. In the light emitting device 400, the switch 103 is arranged between a light source 101 and a positive power supply, and the light source 101 is serially connected with a differentiation circuit 102 arranged at the ground side. The light source 101, the differentiation circuit 102, and the switch 103 of the light emitting device 400 are the same as those described relating to the structure shown in FIG. 3. The operation of the light emitting device 400 is the same as those of the light emitting device 100 shown in FIG. 3 and the light emitting device 300 shown in FIG. 15A.

4. Fourth Embodiment

Figure 16:
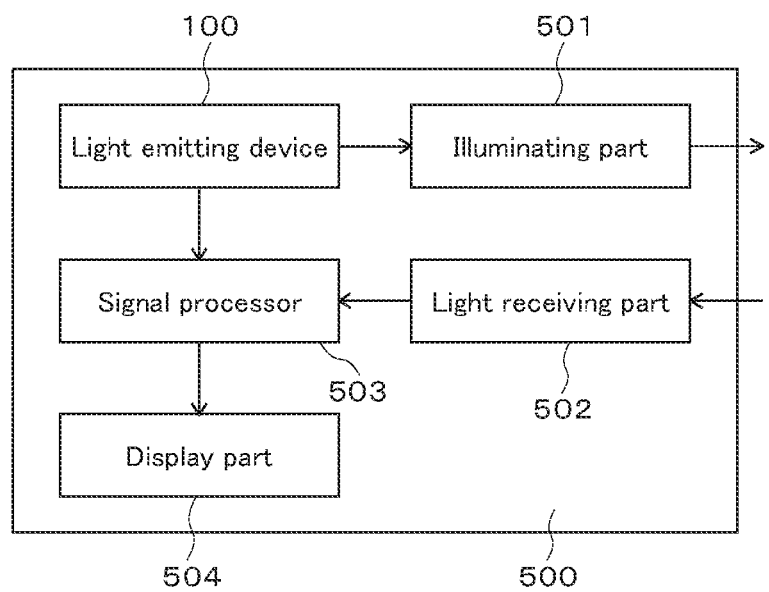
FIG. 16 is a block diagram of a light emitting device of an embodiment.

FIG. 16 shows a distance measuring device 500. The distance measuring device 500 is a device for measuring a distance to an object to be measured using laser light and includes a light emitting device 100, an illuminating part 501, a light receiving part 502, a signal processor 503, and a display part 504.

The light emitting device 100 has the structure shown in FIG. 3. Naturally, another light emitting device exemplified in the present specification can also be used. The illuminating part 501 includes an optical system for illuminating the object with laser light output from the light emitting device 100. The light receiving part 502 includes an optical system and a light receiving element (such as a photo diode or the like) and receives light, which is emitted from the illuminating part 501 and is reflected by the object. The signal processor 503 calculates a distance to the object based on the detected light received by the light receiving part 502. The calculation performed in the signal processor 503 is the same as that in an ordinary laser distance measuring device. The display part 504 is a displaying device such as a liquid crystal display or the like and displays the distance to the object, which is calculated by the signal processor 503.

The distance measuring device 500 uses distance measuring light with a short pulse width generated by the light emitting device 100, whereby the distance is measured with high precision. In addition, the light emitting device 100 has a simple structure and consumes low levels of electric power, and it can be obtained at low production cost, whereby the distance measuring device 500 can be made so as to be small and to consume low levels of electric power, at a low production cost.

Although the laser distance measuring device is exemplified as an example of utilizing the light source of the present invention in this embodiment, the light source of the present invention, which emits pulsed light using the differentiation circuit, can be applied in various types of devices using pulsed light (for example, a laser machining device or the like).

What is claimed is:

1. A method for adjusting a light emitting device having
   a light source that generates a relaxation oscillation immediately after an electric current is applied thereto for driving light emission;
   a capacitive reactance circuit that exhibits low impedance immediately after the electric current is applied thereto and which is chargeable with electrical charge;
   a resistance circuit that discharges electrical charge charged in the capacitive reactance circuit after a predetermined time passes after the electric current is applied;
   a differentiation circuit formed of the capacitive reactance circuit and the resistance circuit, which are connected in parallel; and
   a switching element,
   wherein the light source and the differentiation circuit are connected in series; and the switching element is configured to switch on or off for application of voltage to the light source and the differentiation circuit,
   the method comprising:
   adjusting at least one of capacitance value and impedance of the capacitive reactance circuit so that electric current flows in the light source at not less than a threshold current value for oscillation while an initial oscillation of the relaxation oscillation is generated immediately after the electric current is supplied to the capacitive reactance circuit, and so that the electric current flows in the light source at an amount at which the light emission of the light source does not come to be an oscillation stationary state; and
   adjusting resistance value of the resistance circuit to be not less than a value at which electric current approximately equal to the threshold current value for oscillation of the light source flows and at which the light source does not emit light, and not more than a value, at which a difference between voltage dropped at the resistance circuit and a power-supply voltage is approximately equal to a forward direction voltage of the light source,
   such that light of only the initial oscillation of the relaxation oscillation is emitted.

2. The method for adjusting the light emitting device according to claim 1, wherein the capacitance of the capacitive reactance circuit is increased whereas the resistance value of the resistance circuit is decreased in order to increase a peak value of the emitted light, and the capacitance of the capacitive reactance circuit is decreased whereas the resistance value of the resistance circuit is increased in order to decrease the peak value of the emitted light.

* * * * *